(12) United States Patent
Eberler et al.

(10) Patent No.: US 9,952,298 B2
(45) Date of Patent: Apr. 24, 2018

(54) SPATIAL HOMOGENIZATION OF THE FIELD STRENGTH OF RADIOFREQUENCY PULSES

(71) Applicants: Ludwig Eberler, Neumarkt i.d.OPf (DE); Jürgen Nistler, Erlangen (DE)

(72) Inventors: Ludwig Eberler, Neumarkt i.d.OPf (DE); Jürgen Nistler, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 526 days.

(21) Appl. No.: 14/570,081

(22) Filed: Dec. 15, 2014

(65) Prior Publication Data
US 2015/0168516 A1 Jun. 18, 2015

(30) Foreign Application Priority Data
Dec. 17, 2013 (DE) .......................... 10 2013 226 170

(51) Int. Cl.
| | | |
|---|---|---|
| G01R 33/36 | (2006.01) | |
| G01R 33/58 | (2006.01) | |
| G01R 33/28 | (2006.01) | |

(52) U.S. Cl.
CPC ....... *G01R 33/3607* (2013.01); *G01R 33/583* (2013.01); *G01R 33/28* (2013.01)

(58) Field of Classification Search
None
See application file for complete search history.

(56) References Cited

U.S. PATENT DOCUMENTS

| | | |
|---|---|---|
| 6,927,573 B2 | 8/2005 | Eberler et al. |
| 8,442,616 B2 | 5/2013 | Nistler et al. |
| 2004/0150401 A1* | 8/2004 | Eberler .................. G01R 33/36 324/318 |

(Continued)

FOREIGN PATENT DOCUMENTS

| | | |
|---|---|---|
| DE | 10254660 B4 | 4/2006 |
| DE | 102008063630 A1 | 8/2010 |
| DE | 102011084072 A1 | 4/2013 |

OTHER PUBLICATIONS

German Office Action cited in DR 10 2013 226 170.5, dated Aug. 8, 2014, with English Translation.

*Primary Examiner* — Melissa Koval
*Assistant Examiner* — Felicia Farrow
(74) *Attorney, Agent, or Firm* — Lempia Summerfield Katz LLC

(57) ABSTRACT

A method and a device are provided for spatial homogenization of the field strength of voltages of radiofrequency pulses of a number of RF transmitters, wherein (a) the measured complex voltages, induced by the electromagnetic field of the antenna, of a plurality of field probes, which are disposed in the vicinity of the antenna, are respectively superposed with a fitting phase shift and used for establishing the new desired homogenized voltages of the radiofrequency pulses of the antenna by a complex transfer function, and/or (b) output signals of at least two directional couplers on the RF feed lines of the antenna are superposed in a respectively fitting phase-shifted manner and these are used to establish complex impedances or scattering parameters of a complex scattering matrix of the antenna, which are used for establishing the new desired homogenized voltages of the radiofrequency pulses of the antenna.

16 Claims, 2 Drawing Sheets

(56) References Cited

U.S. PATENT DOCUMENTS

| | | | |
|---|---|---|---|
| 2008/0258728 A1 | 10/2008 | Vernickel et al. | |
| 2013/0221965 A1* | 8/2013 | Nistler | G01R 33/586 |
| | | | 324/314 |
| 2015/0077107 A1* | 3/2015 | Sharp | G01R 33/56563 |
| | | | 324/318 |

* cited by examiner

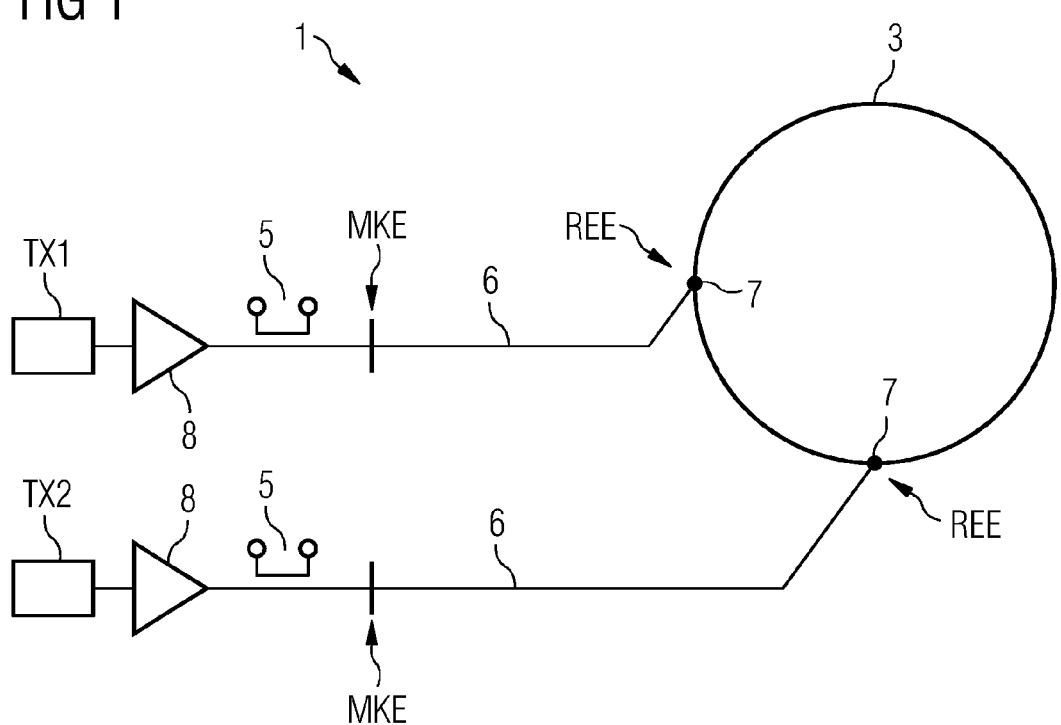

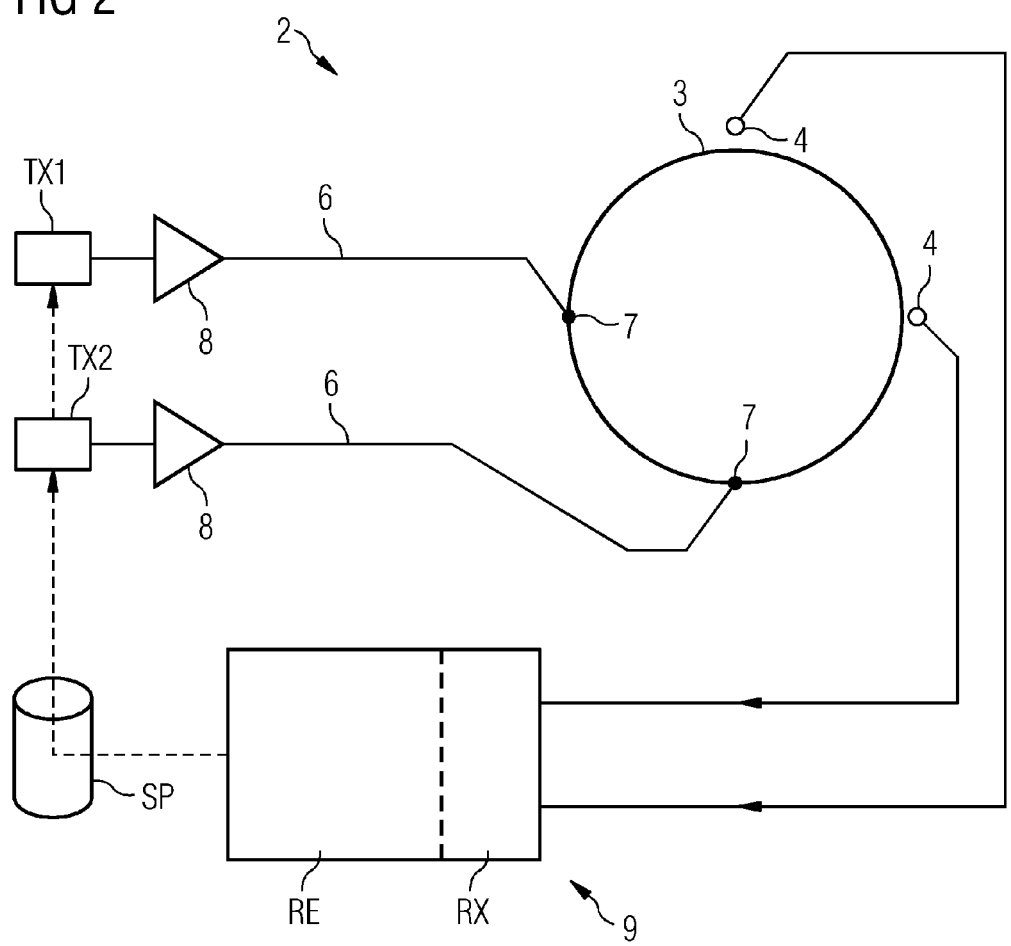

SPATIAL HOMOGENIZATION OF THE FIELD STRENGTH OF RADIOFREQUENCY PULSES

CROSS-REFERENCE TO RELATED APPLICATIONS

This application claims the benefit of DE 10 2013 226 170.5, filed on Dec. 17, 2013, which is hereby incorporated by reference in its entirety.

TECHNICAL FIELD

The embodiments relate to a method and a device for the spatial homogenization of the field strength of radiofrequency pulses of a transmission antenna of a magnetic resonance imaging (MRI) device. Furthermore, the embodiments relate to a magnetic resonance imaging (MRI) device including the device for the spatial homogenization of the field strength of radiofrequency pulses of a transmission antenna.

BACKGROUND

In the case of MRI systems with relatively high main field strengths, (e.g., $B_0 \geq 3$ Tesla), the undesired inhomogeneity of the $B_1$-RF field is a known problem that is caused by the interaction between the human tissue and the RF transmission fields of the transmission antennas, as a result of which a spatial variation in the field distribution is generated. This also includes phenomena such as, e.g., "dielectric resonance," which may lead to field increases in the examination object.

The spatial variation of the RF fields leads to different flip angles during the excitation in MRI imaging sequences, and hence to a signal and contrast variation in the recorded images.

Different field distributions regularly emerge in patients, even in the case of nominally the same excitations (e.g., the CP mode explained below). In addition to the interaction of the patient with the fields, the interaction or reaction of the patient with the antenna, which becomes noticeable as a result of modified input impedances and couplings of the antennas, is an important cause in this respect. By way of example, if the input impedances of the antenna under load with the patient are different, a signal with the same amplitude, applied from the outside, will lead to fields with different amplitudes.

As a result, there may also be effects on the distribution of the specific absorption rate (SAR) of electromagnetic energy in tissue in addition to the field distortions if the excitation no longer corresponds to the desired excitation, e.g., the complex RF voltages of the RF excitation pulse sequences emitted at the transmission antenna(s).

The degree of the reaction of the patient on the antenna depends on the patient size, weight, tissue composition (e.g., proportion of muscle or fat), and the patient position relative to the antenna.

By way of example, the standard excitation is the circularly polarized excitation (CP mode), which, in a 2-channel system, is defined by virtue of the amplitudes of the two transmission channels having the same magnitude and a 90° phase difference. On the transmission antenna, the same currents set in on the rods along the circumference. In reality, variations in the rod currents, which exhibit a factor of 2 between the maximum and minimum current, are observed as a result of the reactions on the input impedances. As a result, the setting-in field distribution differs from the desired CP mode.

A solution to this problem lies in the use of multichannel transmission systems. Here, a plurality of transmission channels, (e.g., at least two), with different field distributions are available. These transmission channels may then be superposed in such a way that the field inhomogeneity is reduced. To this end, so-called "pre-scan" measurements are required prior to the actual examination of the patient, by which the field distribution in the presence of the patient is initially measured as a so-called "$B_1$ map" (e.g., $B_1$ RF field distribution map). Actuation parameters are determined for the transmission channels using the field distributions obtained thus, as a result of which, for example, the field homogeneity is improved. Two channels are not always sufficient for a real compensation of the field inhomogeneities, however.

DE 10254660 B4 discloses a method and a device for temporal correction of the field strength of radiofrequency pulses, which are emitted during a magnetic resonance measurement by a circularly polarizing birdcage antenna of a magnetic resonance measurement apparatus. The current flowing in the antenna during the emission of the radiofrequency pulses is regulated to a predetermined intended value with the aid of a reaction signal by varying power fed into the antenna. In order to form the reaction signal, output signals of two field probes disposed in the vicinity of the antenna at an angle with respect to one another or, alternatively, output signals of two directional couplers on the feed lines of the antenna are superposed with a fitting phase shift. A disadvantage here is that a very complicated closed-loop control circuit is required. This continuously regulates the antenna current, and hence the field strength, to a constant value during the examination of the object or the patient, leading to high development, production, maintenance, repair, and operating costs, and increases the examination time and the load on a patient.

SUMMARY AND DESCRIPTION

The scope of the present invention is defined solely by the appended claims and is not affected to any degree by the statements within this summary. The present embodiments may obviate one or more of the drawbacks or limitations in the related art.

An object of the present embodiments is to develop a method and a device for spatial homogenization of the field strength of radiofrequency pulses of a transmission antenna of an MRI device in such a way that a pre-scan measurement prior to the actual examination of the object (e.g., patient) may occur easily, quickly, and with a high quality of the spatial homogenization.

The following applies to multi-channel systems.

The reaction of the patient on the input impedance and coupling of the antennas or the partial systems thereof is measured and taken into account during the actuation, e.g., excitation (such as complex RF voltage pulse sequences).

This measure is directed to compensating the reaction of the patient on the antenna and therefore achieving the desired field distribution by a calculated excitation of the antennas with the greatest possible accuracy/tolerance or least possible deviation.

The embodiments include a method for the spatial homogenization of the field strength of voltages of radiofrequency pulses of a number (e.g., at least one RF transmitter) or a plurality (e.g., at least two RF transmitters) of RF transmitters. The pulses are emitted by a transmission antenna (which may optionally additionally be operated as reception antenna as well), in particular a circularly or elliptically polarizing antenna, in particular a birdcage antenna, of a magnetic resonance measurement apparatus during a magnetic resonance measurement of an object (e.g. patient) to be examined. The test radiofrequency pulses are emitted in advance during a test measurement.

In certain embodiments, the measured complex voltages, induced by the electromagnetic field of the antenna during the test measurement, of a plurality of field probes, which are disposed offset from one another by a preset angle, in particular 90°, in the vicinity of the antenna, are superposed in a phase-shifted manner, respectively fitting with the preset angle. A complex transfer function is established on the basis of a ratio of the measured complex voltages of the field probes to the complex voltages of the test radiofrequency pulses, which complex transfer function, (e.g., the ratio of the measured complex voltages of the field probes to the complex voltages of the radiofrequency pulses), is used for establishing the new desired homogenized voltages of the radiofrequency pulses of the antenna during a subsequent measurement.

Additionally, or alternatively, output signals of a plurality of directional couplers on the RF feed lines of the antenna are superposed in a respectively fitting phase-shifted manner during the test measurement. These output signals are used to establish complex input impedances or scattering parameters of a complex scattering matrix of the antenna, which are used for establishing the new desired homogenized voltages of the radiofrequency pulses of the antenna during a subsequent measurement.

Advantages of the method include the following: (1) The necessary test measurement variables may be determined quickly or are already in part available in current MRI systems within the scope of legally required SAR monitoring (e.g., specific absorption rate in biological tissue), such as measurement values in W/kg body weight. (2) The compensation takes into account magnitude and phases of the input impedances, which also includes frequency shifts. (3) The achieved field distributions are reproducible. Influences of antenna tuning and of the patient are reduced. (4) $B_1$ map measurements, which would lead to problems relating to additional measurement times, inaccuracies, and artifacts due to the $B_0$ magnetic field or patient respiration, are not required. (5) The SAR values and local SAR values tend to meet expectations. The load on components, (e.g., local coils), may be predicted and defined in an improved manner. Therefore, the risk of overloading the body coils and local coils is reduced.

Overall, an excitation that results in the same excitation pattern on different systems is achieved very quickly using this process.

A device for the spatial homogenization of the field strength of voltages of radiofrequency pulses of a number (e.g., at least one RF transmitter) or of a plurality (e.g., at least two RF transmitters) of RF transmitters in a magnetic resonance measurement apparatus includes a test signal measurement apparatus, including a plurality of field probes that are disposed offset from one another by the same angle value, in particular 90°, in the vicinity of the antenna. The device further includes a computer unit that is designed in such a way that the measured complex voltages Upu-ist, induced by the electromagnetic field of the antenna, of a plurality of field probes, which are disposed in the vicinity of the antenna, are respectively superposed with a fitting phase shift and used for establishing the new desired homogenized voltages Utx-soll of the radiofrequency pulses of the antenna by a complex transfer function (e.g., a ratio of the measured complex voltages Upu-ist of the field probes to the complex voltages Utx-ist of the radiofrequency pulses). Alternatively or additionally, the device for the spatial homogenization of the field strength may also include a test signal measurement apparatus, including a plurality of directional couplers on the RF feed lines of the antenna. In this case, the computer unit is designed in such a way that output signals from a plurality of directional couplers on the RF feed lines of the antenna are in each case superposed in a fitting phase-shifted manner and, using this, complex impedances or scattering parameters of a complex scattering matrix of the antenna are established, which are used for establishing the new desired homogenized voltages Utx-soll of the radiofrequency pulses of the antenna.

In addition to the conventional known components, such as, e.g., a main magnetic field system, a gradient system and a radiofrequency transmission system, and reception system for emitting the radiofrequency pulses and acquiring the raw data using suitable antennas, a magnetic resonance imaging device requires an above-described device for the spatial homogenization of the field strength of the voltages of the emitted radiofrequency pulses.

An embodiment of the measurement apparatus including the field probes is such that the complex transfer function M is determined in the form of an N×N matrix in the desired measurement position of each object to be examined, where N is the number of channels of the feed contacts of the RF transmitters on the antenna, and the desired excitation is calculated thereafter, which excitation emerges from:

$$Utx\text{-}soll = \text{inv}(M) \cdot Upu\text{-}soll,$$

where:
Utx-ist: Actual value of the voltages of the RF transmitters
Utx-soll: Intended value of the voltages of the RF transmitters
Upu-ist: Actual value of the voltages of the field coils
Upu-soll: Intended value of the voltages of the field coils
M: Transfer function as a matrix
Inv(M): Inverse matrix of the transfer function M.

An embodiment of the measurement apparatus including the directional couplers is such that complex scattering parameters of a complex scattering matrix of the complex impedances of the antenna relate to a measurement or calibration plane, which, e.g., is situated on the output of the amplifiers of the RF transmitters.

Furthermore, in this embodiment of the measurement apparatus with the directional couplers, the following acts are performed for the desired measurement position of each object to be examined. In act (a), the complex scattering matrix S1 in the form of an N×N matrix is determined, where N is the number of channels of the feed contacts of the feed lines of the RF transmitters on the antenna. In act (b), the scattering matrix S1 is transformed in the reference plane of the feed contacts of the RF transmitters on the antenna, leading to a transformed scattering matrix S. In act (c), the desired excitation Utx-soll of the RF voltage pulses of the RF transmitters is set, for example on the basis of a mode (CP, EP, etc.) of the antenna. In act (d), the necessary transformed voltages Utx-trans are calculated in order to calculate the desired excitation Utx-soll using the following equation: Utx-trans=inv(E+S)·Utx-soll, where E is the identity matrix. In act (e), the voltages Utx-trans are transformed from the reference plane back into the measurement and calibration plane and hence the excitation voltage of the RF transmitters is calculated.

The aforementioned acts a), b) and d) for the measurement apparatus including the directional couplers may be worked through in this sequence, whereas act c), in terms of time, may also take place long or immediately before act a) or b).

Furthermore, the lengths of the feed lines from the RF transmitters to the antenna may also be taken into account as additional complex impedances of the antenna in the embodiment of the measurement apparatus including the directional couplers. This may be desired in the case of very long and/or strongly damping feed lines.

In particular, the radiofrequency pulses are transmitted from the RF transmitters to the antenna via feed contacts on the antenna, which feed contacts are respectively disposed offset to one another by the same angular value, in particular 90°, in both embodiments, (e.g., both with the field probes and with the directional couplers). It is also possible to use other angles than 90°, (such as, e.g., 30°, 45°, 60°, etc.), as a function of the number of channels of the RF transmitters, wherein the 360° angle of the end rings of the birdcage antenna is subdivided into the same angular regions such that all feed contacts assume approximately the same angular distance from the neighboring feed contacts.

In the embodiment with field probes, which are disposed in the vicinity, within or outside of the contours of the antenna, it is advantageous for these field probes to be disposed on the side lying opposite to the feed contacts of the feed lines, (e.g., respectively offset by 180° thereto). Other relative arrangements between the feed contacts of the RF transmitters and the respectively associated field probes are also possible, e.g., also a 30°, 45°, or 90° offset.

During the test measurement, all field probes are assigned to a single RF transmitter, wherein the remaining RF transmitters then do not emit RF signals. Thus, all channels are measured individually in quick succession in time and fed to the RF receiver and the computer unit for the in-phase superposition and the further calculation of the transfer function.

In particular, the tolerances of the actual RF voltage pulses in relation to the intended RF voltage pulses are less than 10%, in particular less than 5%, or less than 1% at the end of the calibration or the test measurement in both embodiments, e.g., both with the field probes and with the directional couplers.

In addition to the above-explained optimized actuation, the induced voltages of the field probes, and/or the input impedances of the directional couplers may be returned in a closed control loop to an RF receiver, and the desired voltage pulses of the RF transmitters are established in a computer unit and applied to the RF transmitters.

Here, the actual value of the field strength is a controlled variable of the control loop, the intended value of the field strength and/or the measured voltages of the field probes and/or the complex input impedances of the antenna are reference variables of the control loop and the voltage pulses of the number of RF transmitters are the manipulated variables of the control loop.

Both embodiments, e.g., with the field probes or with the directional couplers, may comprise a control loop. Moreover, the two embodiments, e.g., with the field probes or with the directional couplers, may be combined with one another as desired and may have either no, one, two, or else more control loops.

The closed-loop control may additionally be applied in order to keep the spatially homogeneous field distribution constant over time as well.

The information obtained may also be used to improve the superpositions of the signals in the reception case of the body coil.

BRIEF DESCRIPTION OF THE DRAWINGS

FIG. 1 depicts the device in a first embodiment with directional couplers as a pure measurement circuit without a control loop.

FIG. 2 depicts the device in a second embodiment with field probes as a measurement and control loop.

DETAILED DESCRIPTION

FIG. 1 depicts a first embodiment for a 2-channel system, in which the measurement and calibration plane MKE and the "calculation plane," (e.g., reference plane REE), do not coincide.

The RF transmission chain includes two channels including respectively one signal generator TX1, TX2, respectively one RF amplifier 8, respectively one directional coupler 5 and respectively one RF feed cable 6, which are attached to the common antenna 3 in a signal-conducting manner.

The directional couplers 5 serve for measuring the impedances Z, wherein, as is conventional in RF technology, work may be undertaken using complex-valued scattering parameters. The measured scattering parameters relate to a calibration plane MKE that, in this example, lies on the output or in the vicinity of the amplifier 8.

Moreover, an RF feed cable 6, the electrical position of which is known, lies between the amplifier 8 and the antenna 3.

During the setup, the procedure is as follows.

The complex scattering matrix S1 in the desired measurement position is determined for each patient. For N channels, this is an N×N matrix.

The scattering matrix S1 is transformed into the plane REE of the antenna 3 (e.g., feed points 7), wherein the result is the scattering matrix S. Here, it is possible to take into account not only the RF feed cable 6, but also possibly present tuning circuits.

The desired excitation Utx-soll is set, (e.g., for the CP mode), as provided in the equation below:

$$U_{tx}\text{-}soll = \begin{bmatrix} 1 \\ 1 \cdot e^{j \cdot 90°} \end{bmatrix}.$$

The necessary voltages Utx-trans are calculated in order to excite the desired mode, as provided in the equation below:

$U_{tx}$-trans=inv($E+S$)·$U_{tx}$-soll, where $E$ is the so-called "identity matrix" and $S$ is the "scattering matrix".

The voltages Utx-trans are transformed back from the reference plane REE into the measurement and calibration plane MKE and use this to carry out the measurement.

FIG. 2 depicts a further embodiment for a 2-channel system, in which, instead of the directional couplers 5, pickup probes 4 are now used for measuring the RF fields in the vicinity of the antenna 3, within and/or outside of the end rings.

The RF transmission chain once again includes two channels, with respectively one signal generator TX1, TX2, respectively one RF amplifier 8, respectively one RF feed cable 6, which are attached to the common antenna 3 in a signal conducting manner, and respectively one pickup probe 4 in the vicinity, outside of the antenna 3, which are each assigned to one of the channels TX1, TX2.

The pickup probes 4 are attached to the antenna 3 at an angle of 90° with respect to one another, e.g., in the vicinity of the end rings of the antenna 3 and on the side lying opposite to the contacts 7, (e.g., respectively offset by 180° thereto). The pickup probes 4 serve for measuring a transfer function M between the applied voltage Utx and the fields generated by the antenna 3.

During the setup, the procedure is as follows.

The complex "transfer function" M in the desired measurement position is determined for each patient. For N channels, this is an N×N matrix.

The following relationship applies between the applied voltages Utx and the voltages measured at the pickup probes Upu:

$$Upu = M \cdot Utx.$$

As above, the desired excitation Utx-soll is set. The required excitation emerges as described in the equation below:

$$Utx = \text{inv}(M) \cdot Utx\text{-soll}.$$

In the second embodiment according to FIG. 2, the measured values, (e.g., the induced voltages Upu of the field probes 4), are returned to the RF receivers RX. The desired voltage pulses Utx-soll of the RF transmitters TX1, TX2 are established in the computer unit RE and applied to the RF transmitters TX1, TX2.

In certain embodiments, the measured values, (e.g., the induced voltages Upu of the field probes 4), may be returned to the RF receivers RX in a closed control loop 9.

Here, the actual value is the controlled variable, the intended value of the field strength and/or the measured voltages of the field probes Upu-ist are the reference variables and the voltage pulses Utx-soll of the RF transmitters TX1, TX2 are the manipulated variables.

The measurement apparatuses 1, 2 of both embodiments according to FIGS. 1 and 2 each contain two channels with respectively one RF transmitter TX1, TX2, respectively one associated RF amplifier, respectively one RF feed line 6, respectively one RF feed contact 7, and at least one transmission antenna 3 assigned to both channels. In the figures, the transmission antenna 3 is only depicted schematically as a circular ring, but, in reality, it is embodied as a whole body and/or local coil in the form of a circular cylindrical or, for example, a cylindrical birdcage antenna 3 (a type of birdcage structure) with two spaced apart end rings and a multiplicity of longitudinal struts lying therebetween. Both the end rings and the longitudinal struts may be interrupted by electrical components such as, e.g., electrical capacitors.

Furthermore, the first embodiment in FIG. 1 comprises two field probes 4, whereas the second embodiment in FIG. 2 instead comprises two directional couplers 5 and a control loop 9.

The voltage pulses Utx-ist of the two RF transmitters TX1, TX2 prior to calibration are applied to the transmission antenna 3 (in this case birdcage antenna) via the amplifiers 8 and the feed lines 6 and the feed contacts 7. As a result of this, induced voltages Upu are measured in the field coils 4 disposed in the vicinity (e.g., within and/or outside) of the antenna 3.

These measured values, (e.g., the induced voltages Upu), of the field probes 4 are returned in a closed control loop to an RF receiver RX and the desired voltage pulses Utx-soll of the RF transmitters TX1, TX2 are established in a computer unit RE and applied to the RF transmitters TX1, TX2.

Here, reference is once again made to the fact that the specific design depicted in the figures is merely an exemplary embodiment and that the basic principle of the antenna arrangement may be varied. In particular, the procedures described above may be combined if the device includes, e.g., both directional couplers in the feed lines and pickup probes.

Furthermore, reference is also explicitly made to the fact that even if an antenna with two RF transmitters (e.g., two input channels) is depicted in the examples, the embodiments may be used with any number of RF transmitters per antenna and even with only one RF transmitter (e.g., one input channel).

For the sake of completeness, reference is also made to the fact that the use of the indefinite article "a" or "an" does not preclude the relevant features also being able to be present a number of times. Likewise, the term "unit" does not preclude the latter from including a plurality of components which, optionally, may also be distributed in space.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for spatial homogenization of field strength of voltages of radiofrequency pulses of a number of radiofrequency (RF) transmitters, which are emitted by an antenna of a magnetic resonance measurement apparatus during a magnetic resonance measurement of an object to be examined, wherein test radiofrequency pulses are emitted in advance during a test measurement, the method comprising:
    superposing, by a computer unit, in a phase-shifted manner during the test measurement, output signals of a plurality of directional couplers on RF feed lines of the antenna;
    establishing, by the computer unit, complex impedances or scattering parameters of a complex scattering matrix of the antenna with the superposed output signals;
    measuring the magnetic resonance of the object by the magnetic resonance measurement apparatus; and
    establishing, during the measuring, new desired homogenized excitation voltages of radiofrequency pulses of the antenna using the established complex impedances or scattering parameters of the complex scattering matrix.

2. The method as claimed in claim 1, wherein the scattering parameters or the complex impedances relate to a measurement or calibration plane situated in a vicinity of an output of the amplifiers of the number of RF transmitters.

3. The method as claimed in claim 2, wherein lengths of feed lines from the number of RF transmitters to the antenna are taken into account in the directional couplers as additional complex impedances of the antenna.

4. The method as claimed in claim 3, wherein the radiofrequency pulses are transmitted from the number of RF transmitters to the antenna via feed contacts on the antenna, wherein the feed contacts are respectively disposed offset from one another by a same angular value.

5. The method as claimed in claim 4, wherein the voltages measured by the input impedances of the directional couplers are returned in a closed control loop to an RF receiver, and desired excitation voltage pulses of the number of RF transmitters are established in the computer unit and applied to the number of RF transmitters.

6. The method as claimed in claim 2, wherein a desired measurement position of each object to be examined comprises:
  a) determining the complex scattering matrix in the form of an N×N matrix, where N is a number of channels of feed contacts of the feed lines of the number of RF transmitters on the antenna;
  b) transforming the scattering matrix in the reference plane of the feed contacts of the number of RF transmitters on the antenna to provide a transformed scattering matrix;
  c) setting a desired excitation of the RF voltage pulses of the number of RF transmitters on a basis of a mode of the antenna;
  d) calculating necessary transformed voltages using the following equation:

$Utx\text{-}trans = inv(E+S) \cdot Utx\text{-}soll$, wherein:

Utx-trans=the necessary transformed voltages;
  E is an identity matrix;
  S is the scattering matrix; and
  Utx-soll=an intended value of the voltages of the RF transmitters,
  e) transforming the voltages from a reference plane back into a measurement and calibration plane to calculate the desired excitation voltage pulses of the number of RF transmitters.

7. The method as claimed in claim 6, wherein lengths of feed lines from the number of RF transmitters to the antenna are taken into account in the directional couplers as additional complex impedances of the antenna.

8. The method as claimed in claim 1, wherein lengths of feed lines from the number of RF transmitters to the antenna are taken into account in the directional couplers as additional complex impedances of the antenna.

9. The method as claimed in claim 8, wherein the radiofrequency pulses are transmitted from the number of RF transmitters to the antenna via feed contacts on the antenna, wherein the feed contacts are respectively disposed offset from one another by a same angular value.

10. The method as claimed in claim 1, wherein the radiofrequency pulses are transmitted from the number of RF transmitters to the antenna via feed contacts on the antenna, wherein the feed contacts are respectively disposed offset from one another by a same angular value.

11. The method as claimed in claim 1, wherein the voltages measured by the input impedances of the directional couplers are returned in a closed control loop to an RF receiver, and desired excitation voltage pulses of the number of RF transmitters are established in the computer unit and applied to the number of RF transmitters.

12. The method as claimed in claim 11, wherein an actual value of the field strength of the voltages of the radiofrequency pulses is a controlled variable of the closed control loop,
  wherein one or more of an intended value of the field strength or the complex input impedances of the antenna are reference variables of the closed control loop, and
  wherein the desired excitation voltage pulses of the number of RF transmitters are manipulated variables of the closed control loop.

13. The method as claimed in claim 12, wherein tolerances of actual RF voltage pulses in relation to the desired excitation voltage pulses are less than 10% of the calibration or the test measurement.

14. The method as claimed in claim 11, wherein tolerances of actual RF voltage pulses in relation to the desired excitation voltage pulses are less than 10% of the calibration or the test measurement.

15. A device for spatial homogenization of field strength of voltages of radiofrequency pulses of a number of radiofrequency (RF) transmitters in a magnetic resonance measurement apparatus, the device comprising:
  a test signal measurement apparatus comprising a plurality of directional couplers on RF feed lines of an antenna, and a computer unit configured to:
    superpose, in a fitting phase-shifted manner, output signals from a plurality of directional couplers on the RF feed lines of the antenna,
    establish, using the superposed output signals, complex input impedances of the antenna, and
    establish, using the complex input impedances, new desired homogenized voltages of radiofrequency pulses of the antenna.

16. A magnetic resonance imaging (MRI) device, the MRI device comprising:
  a device for spatial homogenization of field strength of voltages of radiofrequency pulses of a number of radiofrequency (RF) transmitters in a magnetic resonance measurement apparatus, the device comprising:
  a test signal measurement apparatus comprising a plurality of directional couplers on RF feed lines of an antenna, and a computer unit configured to:
    superpose, in a fitting phase-shifted manner, output signals from a plurality of directional couplers on the RF feed lines of the antenna, and
    establish, using the superposed output signals, complex input impedances of the antenna, and
    establish, using the complex input impedances, new desired homogenized voltages of radiofrequency pulses of the antenna.

* * * * *